US009842566B2

United States Patent
Lee

(10) Patent No.: US 9,842,566 B2
(45) Date of Patent: Dec. 12, 2017

(54) SHIFT REGISTER AND DISPLAY DEVICE USING THE SAME

(71) Applicant: LG DISPLAY CO., LTD., Seoul (KR)

(72) Inventor: Young-Jang Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 178 days.

(21) Appl. No.: 14/839,367

(22) Filed: Aug. 28, 2015

(65) Prior Publication Data

US 2016/0071614 A1 Mar. 10, 2016

(30) Foreign Application Priority Data

Sep. 5, 2014 (KR) .................. 10-2014-0119099

(51) Int. Cl.
| | |
|---|---|
| *G11C 19/18* | (2006.01) |
| *G09G 5/00* | (2006.01) |
| *G11C 19/28* | (2006.01) |
| *G09G 3/36* | (2006.01) |

(52) U.S. Cl.
CPC ........... *G09G 5/006* (2013.01); *G09G 3/3677* (2013.01); *G11C 19/28* (2013.01); *G09G 2230/00* (2013.01); *G09G 2310/0283* (2013.01); *G09G 2310/0286* (2013.01)

(58) Field of Classification Search
None
See application file for complete search history.

(56) References Cited

U.S. PATENT DOCUMENTS

| | | | | |
|---|---|---|---|---|
| 2008/0012818 A1* | 1/2008 | Lee | ...................... | G09G 3/3677 345/100 |
| 2011/0157124 A1* | 6/2011 | Jung | ...................... | G11C 19/28 345/211 |
| 2014/0168044 A1* | 6/2014 | Hu | ...................... | G09G 3/3696 345/90 |

FOREIGN PATENT DOCUMENTS

| | | |
|---|---|---|
| CN | 1953101 A | 4/2007 |
| KR | 10-2006-0134758 A | 12/2006 |

* cited by examiner

*Primary Examiner* — Carolyn R Edwards
*Assistant Examiner* — Krishna Neupane
(74) *Attorney, Agent, or Firm* — Birch, Stewart, Kolasch & Birch, LLP

(57) ABSTRACT

Discussed is a shift register capable of reducing a circuit area through simplification of a logic circuit configuration. The shift register according to an embodiment includes stages each selectively executing a forward scan and a backward scan. Each stage includes a pull-up transistor for generating a first clock under control of a control node, as an output thereof, a pull-down transistor for generating a gate-off voltage under control of a third clock, as an output thereof, a first transistor for setting and resetting the control node during the forward scan while resetting the control node during the backward scan, under control of a fourth clock, using output signals from a previous stage, and a second transistor for setting and resetting the control node during the backward scan while resetting the control node during the forward scan, under control of a second clock, using output signals from a next stage.

14 Claims, 11 Drawing Sheets

SHIFT REGISTER AND DISPLAY DEVICE USING THE SAME

This application claims the priority benefit of the Korean Patent Application No. 10-2014-0119099, filed on Sep. 5, 2014, which is hereby incorporated by reference as if fully set forth herein.

BACKGROUND OF THE INVENTION

Field of the Invention

The present invention relates to a shift register and, more particularly, to a shift register capable of reducing a circuit area through simplification of a logic circuit configuration and to a display device using the same.

Discussion of the Related Art

Representative examples of a flat display device recently highlighted as a display device include a liquid crystal display (LCD) using liquid crystals, an organic light emitting diode (OLED) display using OLEDs, an electrophoretic display (EPD) using electrophoretic particles, and the like.

Such a flat display device includes a display panel for displaying an image through a pixel matrix including pixels each independently driven by thin film transistors (TFTs), a panel driver for driving the display panel, and a timing controller for controlling the panel driver. The panel driver includes a gate driver for driving gate lines of the display panel, and a data driver for driving data lines of the display panel.

In recent years, a gate-in-panel (GIP) structure, in which a gate driver is formed on a substrate, together with a TFT array of a pixel matrix, has been mainly used in order to achieve a reduction in manufacturing costs and a reduction in bezel width. Such a GIP type gate driver is being developed toward a reduction in circuit area in order to achieve a further reduction in bezel width.

The gate driver outputs scan pulses to drive respective gate lines, using a shift register. The shift register includes a plurality of stages for driving a plurality of gate lines, respectively. Each stage includes an output unit and a node controller. The output unit of each stage basically includes a pull-up TFT for outputting a certain clock to the corresponding gate line under control of a Q-node, and a pull-down TFT for outputting a gate-low voltage to the gate line under control of a QB-node. The node controller of each stage includes a plurality of TFTs for controlling charge and discharge of the Q-node and charge and discharge of the QB-node in a reverse manner. In particular, the number of TFTs to maintain the QB-node in a high-level state is relatively great.

Meanwhile, in the case of a shift register configured to enable a bi-scan for selective utilization of a forward scan and a backward scan, each stage thereof should include a greater number of TFTs.

For this reason, in shift registers according to the related art, it is difficult to achieve a reduction in circuit area due to the use of a great number of TFTs and, as such, there is a limitation in realizing a narrow bezel.

SUMMARY OF THE INVENTION

Accordingly, the present invention is directed to a shift register and a display device using the same that substantially obviate one or more problems due to limitations and disadvantages of the related art.

An object of the present invention is to provide a shift register capable of reducing a circuit area through simplification of a logic circuit configuration and to provide a display device using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a shift register according to an embodiment includes a plurality of stages each selectively executing a forward scan and a backward scan, wherein each of the stages uses first to fourth clocks, and each of the stages includes a pull-up transistor for generating the first clock under control of a control node, as an output thereof, a pull-down transistor for generating a gate-off voltage under control of the third clock, as an output thereof, a first transistor for setting and resetting the control node during the forward scan while resetting the control node during the backward scan, under control of the fourth clock, using output signals from a previous one of the stages, and a second transistor for setting and resetting the control node during the backward scan while resetting the control node during the forward scan, under control of the second clock, using output signals from a next one of the stages.

Each of the first to fourth clocks may have a pulse width corresponding to a period of 2H, a cycle corresponding to a period of 4H, and an overlap period of 1H overlapping another one of the first to fourth clocks, which is adjacent to the clock.

During the forward scan, the first to fourth clocks may circulate in the order of the first clock, the second clock, the third clock and the fourth clock while phase-shifting.

During the backward scan, the first to fourth clocks may circulate in the order of the fourth clock, the third clock, the second clock and the first clock while phase-shifting.

During the forward scan, the first transistor may set the control node under control of the fourth clock, using one output signal from the previous stage, before the pull-up transistor outputs the first clock. During the forward scan, the first transistor may reset the control node under control of the fourth clock, using the output signal from the previous stage, after the pull-up transistor outputs the first clock. During the forward scan, the second transistor may reset the control node under control of the second clock, using one output signal from the next stage, while alternating with the first transistor.

During the backward scan, the second transistor may set the control node under control of the second clock, using one output signal from the next stage, before the pull-up transistor outputs the first clock. During the backward scan, the second transistor may reset the control node under control of the second clock, using the output signal from the next stage, after the pull-up transistor outputs the first clock. During the backward scan, the first transistor may reset the control node under control of the fourth clock, using one output signal from the previous stage, while alternating with the second transistor.

In another aspect of the present invention, a shift register includes a plurality of stages, wherein each of the stages includes a pull-up transistor for generating a first one of a plurality of clocks under control of a control node, as an output thereof, a pull-down transistor for generating a gate-off voltage under control of a second one of the clocks, as an output thereof, the second clock having a reverse phase to the first clock, a first transistor for setting and resetting the control node under control of the second clock, using output signals from a previous one of the stages, and a second transistor for resetting the control node under control of the first clock, using an output signal from a next one of the stages, while alternating with the first transistor.

The control node may include a first control node connected to the first and second transistors, and a second control node connected to the pull-up transistor. Each of the stages may further include a resistive transistor for connecting the first and second control nodes under control of the second clock, a bias transistor for driving a corresponding one of gate lines through an output terminal of the stage in accordance with an abnormal power-off detect signal, and a capacitor connected, at one end thereof, to one of a first node between the pull-up transistor and the pull-down transistor and a second node between a supply line for the gate-off voltage and the pull-down transistor while being connected, at the other end thereof, to the second control node.

In another aspect of the present invention, a display device includes the above-described shift register, to drive gate lines of a display panel, using the shift register.

The shift register according to the embodiments of the present invention has a relatively simple circuit configuration, irrespective of single-scan stages or bi-scan stages included therein, and, as such, it is possible to reduce a circuit area.

The display device according to the embodiments of the present invention uses the shift register having a simple circuit configuration, as a gate driver, and, as such, it is possible to reduce the width of the bezel, at which the gate driver is formed. Thus, a narrow bezel can be realized.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Figure 1:
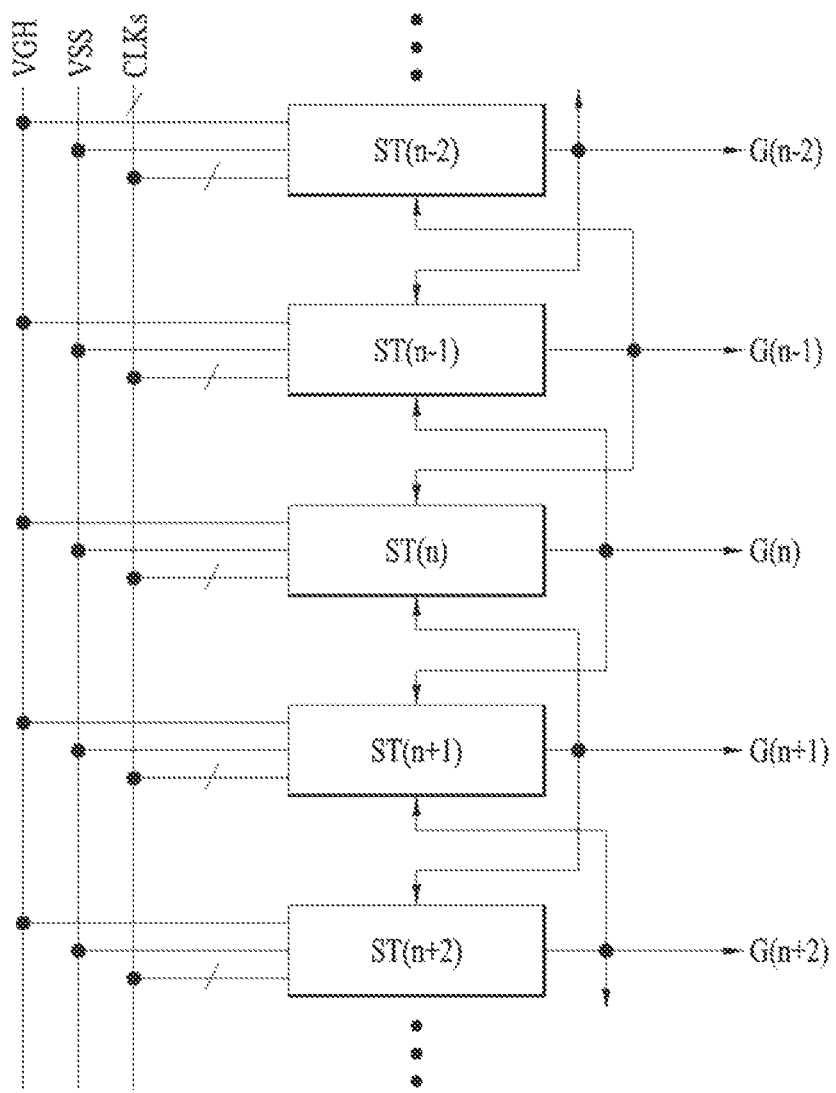
FIG. 1 is a block diagram illustrating a basic configuration of a shift register according to an embodiment of the present invention.

FIG. 1 is a block diagram illustrating a basic configuration of a shift register according to an embodiment of the present invention.

The shift register illustrated in FIG. 1 can be used as a gate-in-panel (GIP) type gate driver of an active matrix type display device. The shift register includes a plurality of stages ST(n−2) to ST(n+2) for driving a plurality of gate lines GL(n−2) to GL(n+2), respectively. Each of the stages ST(n−2) to ST(n+2) scans a corresponding one of the gate lines GL(n−2) to GL(n+2) in a forward direction or in a backward direction.

Typically, a gate-high voltage VGH and a low-level voltage VSS are supplied to each of the stages ST(n−2) to ST(n+2). In some cases, however, a high-level voltage of a certain clock may be used without supply of the gate-high voltage VGH. The gate-high voltage VGH may be referred to as a "gate-on voltage", and the low-level voltage VSS may be referred to as a "gate-low voltage" or "gate-off voltage".

A plurality of clocks CLKs having a phase difference between successive ones thereof is supplied to each of the stages ST(n−2) to ST(n+2). For example, each of the stages ST(n−2) to ST(n+2) is connected to four clock lines to respectively transfer 4-phase clocks CLKs.

In each of the stages ST(n−2) to ST(n+2), a scan signal output from one of previous stages and a scan signal output from one of next stages are supplied, as a charging/discharging signal, to the Q-node to control the output unit.

For example, in the n-th stage ST(n), an n−1-th scan signal G(n−1) output from the n−1-th stage ST(n−1) and an n+1-th scan signal G(n+1) output from the n+1-th stage ST(n+1) are supplied as a charging/discharging signal for the Q-node.

In the following description, a high-level state of the Q-node preferably means a gate-on state and, as such, may be referred to as a "set state". A low-level state of the O-node preferably means a gate-off state and, as such, may be referred to as a "reset state". However, other meanings/variations are possible.

Figure 2:
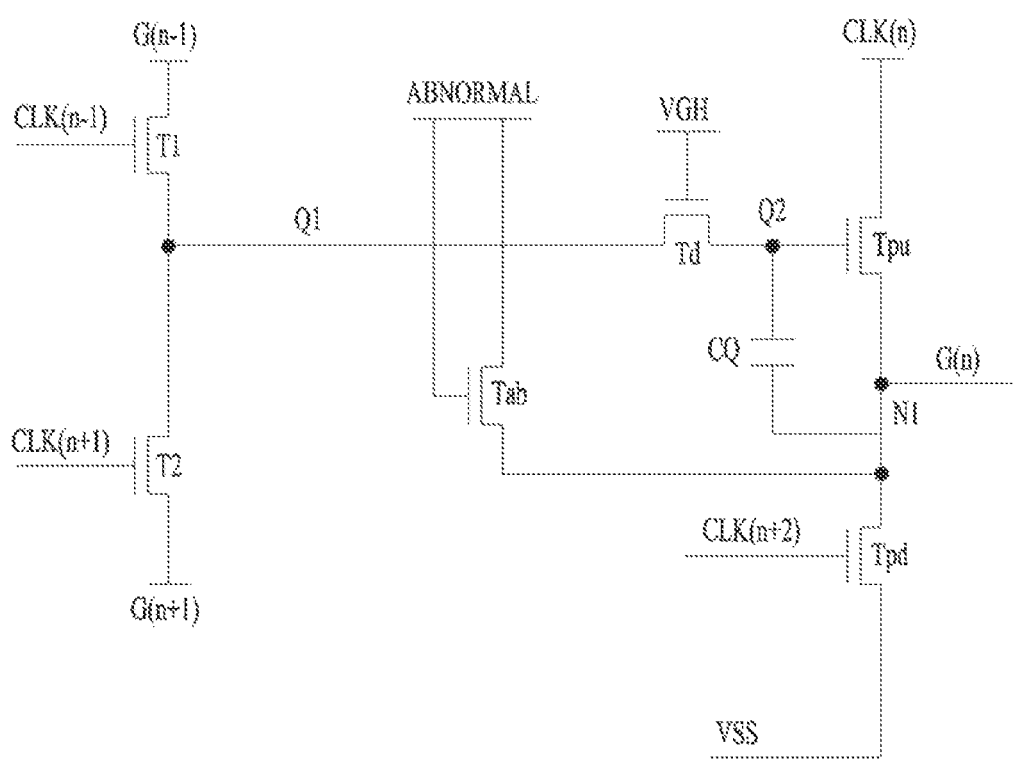
FIG. 2 is a circuit diagram illustrating one stage of a bi-scan shift register according to a first embodiment of the present invention.
Figure 3:
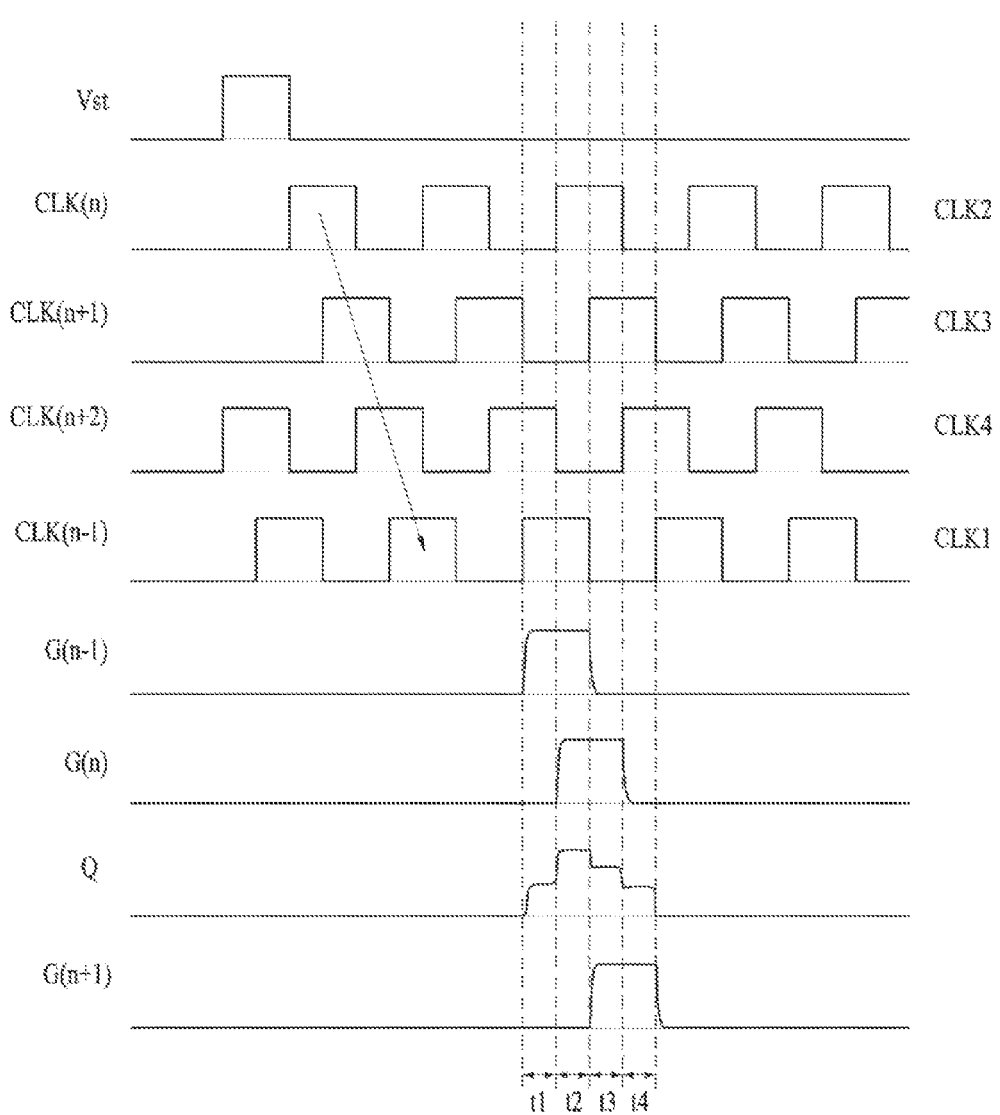
FIG. 3 is a waveform diagram of driving signals for a forward scan of the stage illustrated in FIG. 2.
Figure 4:
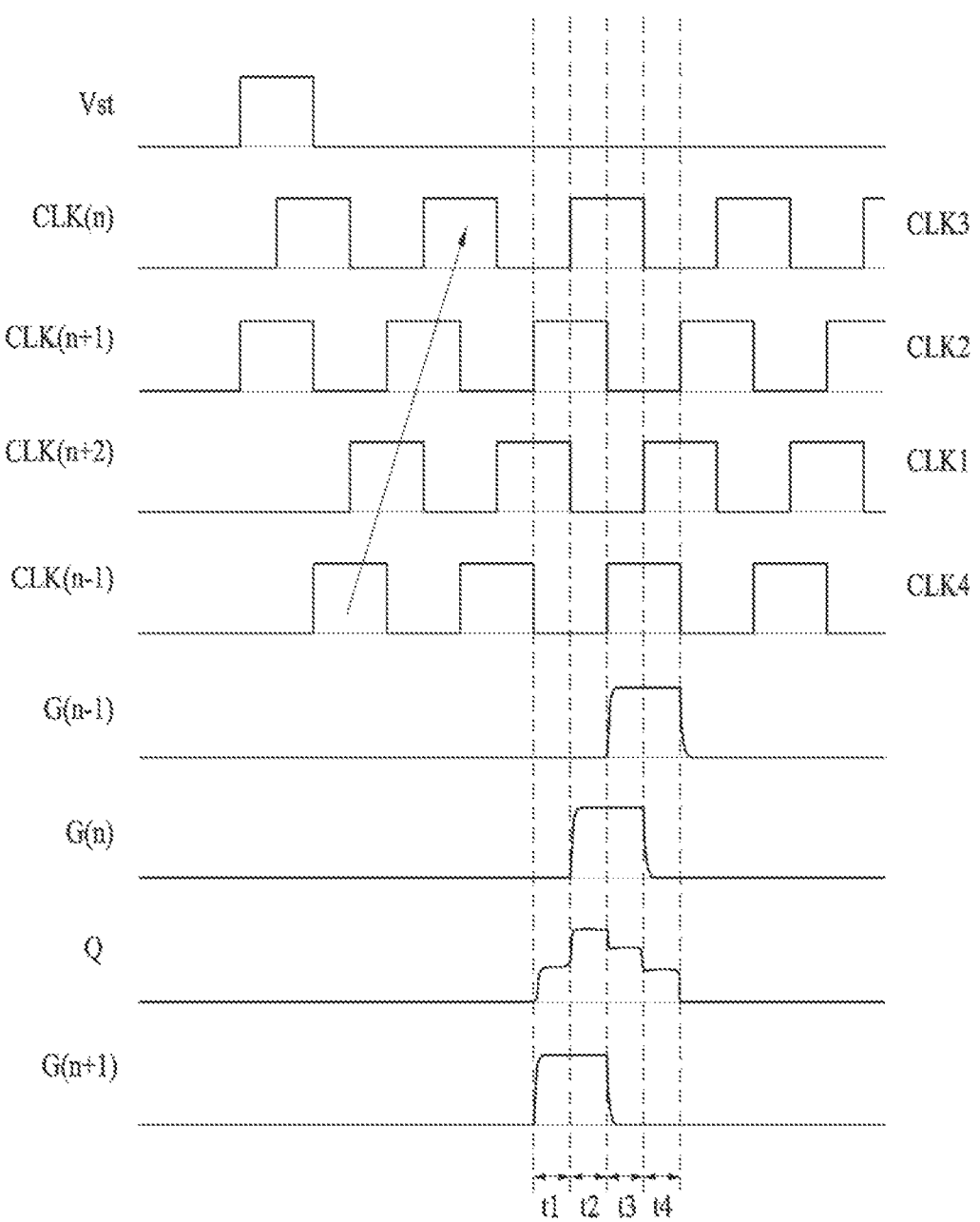
FIG. 4 is a waveform diagram of driving signals for a backward scan of the stage illustrated in FIG. 2.

FIG. 2 is a circuit diagram illustrating one stage of a bi-scan shift register according to a first embodiment of the present invention. FIGS. 3 and 4 are waveform diagrams of driving signals for a forward scan and a backward scan of the stage illustrated in FIG. 2.

The n-th stage ST(n) illustrated in FIG. 2 drives the n-th gate line. The configuration and operation of the n-th stage ST(n) is applied to other stages in the same manner.

The n-th stage ST(n) includes an output unit including a pull-up TFT Tpu, a pull-down TFT Tpd and a capacitor CQ, and a node controller including first and second TFTs T1 and T2.

The n-th stage ST(n) further includes a resistive TFT Td connected between an output node of the node controller, namely, a Q1-node, and a control node of the output unit, namely, a Q2-node, to function as a resistor.

The n-th stage ST(n) may further include a bias TFT Tab for driving the corresponding gate line in order to achieve rapid discharge of the pixel matrix when abnormal power-off occurs.

The n-th stage ST(n) receives 4-phase clocks CLK(n), CLK(n+1), CLK(n+2) and CLK(n−1) circulating while successively phase-shifting. The phase of each of the 4-phase clocks CLK(n), CLK(n+1), CLK(n+2) and CLK(n−1) is variable to vary a shift order during forward scan and backward scan.

For example, as illustrated in FIGS. 3 and 4, the 4-phase clocks CLK(n), CLK(n+1), CLK(n+2) and CLK(n−1) are configured to circulate while successively phase-shifting at intervals of a period of 1H. Each of the 4-phase clocks CLK(n), CLK(n+1), CLK(n+2) and CLK(n−1) is configured to have a cycle corresponding to a period of 4H including a period of 2H in a high-level state and a period of 2H in a low-level state and, as such, adjacent ones of the 4-phase clocks CLK(n), CLK(n+1), CLK(n+2) and CLK(n−1) overlap each other in a period of 1H in a high-level state. The clock CLK(n) is reverse in phase to the clock CLK(n+2). The clock CLK(n+1) is reverse in phase to the clock CLK(n−1).

During the forward scan, the 4-phase clocks CLK(n), CLK(n+1), CLK(n+2) and CLK(n−1) circulate while phase-shifting at intervals of a 1H period in an order of CLK(n), CLK(n+1), CLK(n+2) and CLK(n−1), as illustrated in FIG. 3. On the other hand, during the backward scan, the 4-phase clocks CLK(n), CLK(n+1), CLK(n+2) and CLK(n−1) circulate while phase-shifting at intervals of a 1H period in an order of CLK(n−1), CLK(n+2), CLK(n+1) and CLK(n), as illustrated in FIG. 4.

For example, as illustrated in FIG. 3, during the forward scan, 4-phase clocks CLK1 to CLK4 circulate while phase-shifting at intervals of a 1H period in an order of CLK2, CLK3, CLK4 and CLK1. During the backward scan, phases of the clocks CLK2, CLK3, CLK4 and CLK1 are varied to those of the clocks CLK3, CLK2, CLK1 and CLK4, respectively, as illustrated in FIG. 4. Thus, the 4-phase clocks CLK1 to CLK4 are configured to phase-shift at intervals of a 1H period in an order of CLK4, CLK1, CLK2 and CLK3.

The pull-up TFT Tpu is switched under control of the Q2-node, to supply the n-th clock CLK(n) to the n-th gate line via an output node N1. Accordingly, as illustrated in FIGS. 3 and 4, in a period t2-t3, a high-level voltage of the n-th clock CLK(n) is supplied as a gate-on voltage (gate-high voltage) of the n-th scan signal G(n) via the pull-up TFT Tpu. In each frame, in accordance with the n-th clock CLK(n), the scan signal G(n) outputs a gate-on voltage for a 2H period while supplying a gate-off voltage for the remaining period. In this case, the gate-on voltage of the scan signal G(n) overlaps that of the adjacent scan signal for a 1H period.

The pull-down TFT Tpd is switched under control of the n+2-th clock CLK(n+2), which is reverse in phase to the n-th clock CLK(n), to supply the low-level voltage VSS to the n-th gate line via the output node N1. Accordingly, as illustrated in FIGS. 3 and 4, during a period of 2H from a period t4, a low-level voltage VSS is supplied as a gate-off voltage (gate-low voltage) of the n-th scan signal G(n) via the pull-down TFT Tpd.

The first TFT T1 is switched under control of the n−1-th clock CLK(n−1), to supply the n−1-th scan signal G(n−1) output from the n−1-th stage to the Q1-node. Accordingly, the Q1-node and Q2-node connected via the resistive TFT Td are charged in accordance with a gate-on voltage of the n−1-th scan signal G(n−1) or are discharged in accordance with a gate-off voltage of the n−1-th scan signal G(n−1). When the n-th stage ST(n) is the first stage, a start pulse Vst illustrated in FIGS. 3 and 4 is supplied as the n−1-th scan signal G(n−1).

In detail, as illustrated in FIG. 3, during the forward scan, the first TFT T1 turns on, under control of the n−1-th clock CLK(n−1) preceding the n-th clock CLK(n) by a 1H period, in a period from a period t1 before the pull-up TFT Tpu outputs the n-th clock CLK(n) to the period t2 in which the pull-up TFT Tpu outputs the n-th clock CLK(n), and, as such, supplies the gate-on voltage of the n−1-th scan signal G(n−1), thereby setting the Q1-node and Q2-node to a high-level state.

In addition, as illustrated in FIG. 3, during the forward scan, the first TFT T1 turns on under control of the n−1-th clock CLK(n−1) after the pull-up TFT Tpu outputs the n-th clock CLK(n) and, as such, supplies the gate-off voltage of the n−1-th scan signal G(n−1), thereby resetting the Q1-node and Q2-node to a low-level state.

Meanwhile, as illustrated in FIG. 4, during the backward scan, the first TFT T1 turns on, under control of the n−1-th clock CLK(n−1) delayed from the n-th clock CLK(n) by a 1H period, in a period from the period t3 in which the pull-up TFT Tpu outputs the n-th clock CLK(n) to the period t4 after the n-th clock CLK(n) has been output, and, as such, supplies the gate-on voltage of the n−1-th scan signal G(n−1) to the Q1-node and Q2-node. Thus, the high-level voltage of the n-th clock CLK(n) is supplied to the output node N1 via the pull-up transistor Tpu in the period t3, whereas the low-level voltage of the n-th clock CLK(n) is supplied to the output node N1 in the period t4.

In addition, irrespective of the forward scan illustrated in FIG. 3 and the backward scan illustrated in FIG. 4, the first TFT T1 periodically turns on under control of the n−1-th clock CLK(n−1) when the n−1-th scan signal G(n−1) is in a gate-off state and, as such, supplies the gate-off voltage of the n−1-th scan signal G(n−1), thereby maintaining the Q1-node and Q2-node at a reset state.

The second TFT T2 is switched under control of the n+1-th clock CLK(n+1), to supply the n+1-th scan signal G(n+1) output from the n+1-th stage to the Q1-node. Accordingly, the Q1-node and Q2-node are charged in accordance with a gate-off voltage of the n+1-th scan signal G(n+1) or are discharged in accordance with a gate-on voltage of the n+1-th scan signal G(n+1). When the n-th stage ST(n) is the last stage, the start pulse Vst illustrated in FIGS. 3 and 4 is supplied as the n+1-th scan signal G(n+1).

In detail, as illustrated in FIG. 4, during the backward scan, the second TFT T2 turns on, under control of the n+1-th clock CLK(n+1) preceding the n-th clock CLK(n) by a 1H period, in a period from the period t1 before the pull-up TFT Tpu outputs the n-th clock CLK(n) to the period t2 in which the pull-up TFT Tpu outputs the n-th clock CLK(n), and, as such, supplies the gate-on voltage of the n+1-th scan signal G(n+1), thereby setting the Q1-node and Q2-node to a high-level state.

In addition, as illustrated in FIG. 4, during the backward scan, the second TFT T2 turns on under control of the n+1-th clock CLK(n+1) after the pull-up TFT Tpu outputs the n-th clock CLK(n) and, as such, supplies the gate-off voltage of the n+1-th scan signal G(n+1), thereby resetting the Q1-node and Q2-node to a low-level state.

Meanwhile, as illustrated in FIG. 3, during the forward scan, the second TFT T2 turns on, under control of the n+1-th clock CLK(n+1) delayed from the n-th clock CLK(n) by a 1H period, in a period from the period t3 in which the pull-up TFT Tpu outputs the n-th clock CLK(n) to the period t4 after the n-th clock CLK(n) has been output, and, as such, supplies the gate-on voltage of the n+1-th scan signal G(n+1) to the Q1-node and Q2-node. Thus, the high-level voltage of the n-th clock CLK(n) is supplied to the output node N1 via the pull-up transistor Tpu in the period t3, whereas the low-level voltage of the n-th clock CLK(n) is supplied to the output node N1 in the period t4.

In addition, irrespective of the forward scan illustrated in FIG. 3 and the backward scan illustrated in FIG. 4, the second TFT T2 periodically turns on under control of the n+1-th clock CLK(n+1) when the n+1-th scan signal G(n+1) is in a gate-off state and, as such, supplies the gate-off voltage of the n−1-th scan signal G(n−1), thereby maintaining the Q1-node and Q2-node at a reset state.

Although the resistive TFT Td always turns on in accordance with the gate-high voltage VGH, thereby connecting the Q1-node and Q2-node, the resistive TFT Td functions as a resistor causing voltages of the Q1-node and Q2-node to differ from each other. Accordingly, when the voltage of the Q2-node rises in accordance with bootstrapping thereof along the n-th clock CLK(n), the voltage of the Q1-node rises to a lower voltage level than the voltage of the Q2-node and, as such, it is possible to reduce hot carrier stress of the Q1-node caused by bootstrapping.

The bias TFT Tab turns on in accordance with an abnormal detect signal ABNORMAL supplied from a power supply circuit when abnormal power-off occurs and, as such, drives the corresponding gate line. In this case, the bias TFTs of all stages simultaneously drive all gate lines in accordance with the abnormal detect signal ABNORMAL and, as such, all TFTs of the pixel matrix simultaneously turn on. Accordingly, charges stored in sub-pixels may be rapidly discharged through the turned-on TFTs. Thus, even when abnormal power-off occurs due to separation of a battery or the like, it is possible to prevent flickering caused by insufficient discharge because charges in the pixel matrix are rapidly discharged.

A capacitor CQ is connected between a gate and a drain in the pull-up TFT Tpu, namely, between the Q2-node and the output node N1. When the pull-up TFT Tpu is in an ON state, the capacitor CQ performs a bootstrapping function to raise the voltage of the Q2-node along the n-th clock CLK(n). In addition, when the pull-up TFT Tpu is in an OFF state, the capacitor CQ performs a ripple reducing function to reduce ripple of the Q-node along the n-th clock CLK(n). To this end, the capacitor CQ has a relatively large capacity.

The n−1-th clock CLK(n−1) to control the first TFT T1 is supplied while preceding the n-th clock CLK(n) by the 1H period during a forward scan. During a backward scan, the n−1-th clock CLK(n−1) is supplied while being delayed from the n-th clock CLK(n) by the 1H period.

Conversely, the n+1-th clock CLK(n+1) to control the second TFT T2 is supplied while preceding the n-th clock CLK(n) by the 1H period during a backward scan. During a forward scan, the n+1-th clock CLK(n+1) is supplied while being delayed from the n-th clock CLK(n) by the 1H period.

Thus, according to the present invention, it is possible to control a forward scan direction and a backward scan direction through phase reversion of the n−1-th clock CLK(n−1) and n-th-th clock CLK(n+1) to respectively control the first and second TFTs T1 and T2. Accordingly, it is unnecessary to use a separate direction control signal or a separate direction control TFT in order to control scan directions.

Hereinafter, a forward scan operation of the stage illustrated in FIG. 2 will be described in detail with reference to FIG. 3.

In the period t1-t2, the first TFT T1 turns on under control of the n−1-th clock CLK(n−1) (CLK1), to supply a gate-on voltage of the n−1-th scan signal G(n−1), and, as such, the Q1-node and Q2-node are set to a high-level state, thereby turning on the pull-up TFT Tpu. In the period t1, a low-level voltage of the n-th clock CLK(n) (CLK2) is supplied to the output node N1 via the pull-up TFT Tpu, and the pull-down TFT Tpd also turns on under control of the n+2-th clock CLK(n+2) (CLK4), to supply the low-level voltage VSS to the output node N1. Accordingly, the n-th scan signal G(n) of the n-th gate line outputs a gate-off voltage. Subsequently, in the period t2, the high-level voltage of the n-th clock CLK(n) (CLK2) supplied via the pull-up TFT (Tpu) is output through the output node N1 as a gate-on voltage of the n-th scan signal G(n).

In the periods t3 and t4, the second TFT T2 turns on under control of the n+1-th clock CLK(n+1) (CLK3), to supply a gate-on voltage of the n+1-th scan signal G(n+1), and, as such, the Q1-node and Q2-node are maintained in a high-level state, thereby maintaining the pull-up TFT Tpu in an ON state. Similarly to the period t2, in the period t3 following the period t2, the high-level voltage of the n-th clock CLK(n) (CLK2) supplied via the pull-up TFT (Tpu) is output through the output node N1 as a gate-on voltage of the n-th scan signal G(n). Subsequently, in the period t4, a low-level voltage of the n-th clock CLK(n) (CLK2) is supplied to the output node N1 via the pull-up TFT Tpu, and the pull-down TFT Tpd also turns on under control of the n+2-th clock CLK(n+2) (CLK4), to supply the low-level voltage VSS to the output node N1. Accordingly, the n-th scan signal G(n) of the n-th gate line outputs a gate-off voltage.

After the period t4, the first and second TFTs T1 and T2 alternately turn on under control of the alternating n−1-th clock CLK(n−1) (CLK1) and n+1-th clock CLK(n+1) (CLK3). Accordingly, a gate-off voltage of the n−1-th clock CLK(n−1) and a gate-off voltage of the n+1-th clock CLK(n+1) are alternately supplied to the Q1-node and Q2-node and, as such, the Q1-node and Q2-node are maintained in a reset state. In accordance with the n+2-th clock CLK(n+2) (CLK4), the pull-down TFT Tpd periodically turns on and, as such, the n-th scan signal G(n) of the n-th gate line is maintained in a gate-off voltage state.

Hereinafter, a backward scan operation of the stage illustrated in FIG. 2 will be described in detail with reference to FIG. 4.

Referring to FIG. 4, it can be seen that the 4-phase clocks circulating while phase-shifting at intervals of a 1H period in the order of CLK(n), CLK(n+1), CLK(n+2) and CLK(n−1) during a forward scan are varied in phase during a backward scan illustrated in FIG. 4, to circulate while phase-shifting at intervals of a 1H period in the order of CLK(n−1), CLK(n+2), CLK(n+1) and CLK(n).

In the period t1-t2, the second TFT T2 turns on under control of the n+1-th clock CLK(n+1) (CLK2), to supply a gate-on voltage of the n+1-th scan signal G(n+1), and, as such, the Q1-node and Q2-node are set to a high-level state, thereby turning on the pull-up TFT Tpu. In the period t1, a low-level voltage of the n-th clock CLK(n) (CLK3) is supplied to the output node N1 via the pull-up TFT Tpu, and the pull-down TFT Tpd also turns on under control of the n+2-th clock CLK(n+2) (CLK1), to supply the low-level voltage VSS to the output node N1. Accordingly, the n-th scan signal G(n) of the n-th gate line outputs a gate-off voltage. Subsequently, in the period t2, the high-level voltage of the n-th clock CLK(n) (CLK3) supplied via the pull-up TFT (Tpu) is output through the output node N1 as a gate-on voltage of the n-th scan signal G(n).

In the periods t3 and t4, the first TFT T1 turns on under control of the n−1-th clock CLK(n−1) (CLK4), to supply a gate-on voltage of the n−1-th scan signal G(n−1), and, as such, the Q1-node and Q2-node are maintained in a high-level state, thereby maintaining the pull-up TFT Tpu in an ON state. Similarly to the period t2, in the period t3 following the period t2, the high-level voltage of the n-th clock CLK(n) (CLK3) supplied via the pull-up TFT (Tpu) is output through the output node N1 as a gate-on voltage of the n-th scan signal G(n). Subsequently, in the period t4, a low-level voltage of the n-th clock CLK(n) (CLK3) is supplied to the output node N1 via the pull-up TFT Tpu, and the pull-down TFT Tpd also turns on under control of the n+2-th clock CLK(n+2) (CLK1), to supply the low-level voltage VSS to the output node N1. Accordingly, the n-th scan signal G(n) of the n-th gate line outputs a gate-off voltage.

After the period t4, the second and first TFTs T2 and T1 alternately turn on under control of the alternating n+1-th clock CLK(n+1) (CLK2) and n−1-th clock CLK(n−1) (CLK4). Accordingly, a gate-off voltage of the n+1-th clock CLK(n+1) and a gate-off voltage of the n−1-th clock CLK (n−1) are alternately supplied to the Q1-node and Q2-node and, as such, the Q1-node and Q2-node are maintained in a reset state. In accordance with the n+2-th clock CLK(n+2) (CLK1), the pull-down TFT Tpd periodically turns on and, as such, the n-th scan signal G(n) of the n-th gate line is maintained in a gate-off voltage state.

Thus, the shift register according to one or more embodiments of the present invention may not only eliminate a QB-node to control a pull-down TFT and a plurality of TFTs to control the QB-node, which are required in conventional cases, but also eliminates a plurality of TFTs to maintain a Q-node in a low-level state, by controlling the first and second TFTs T1 and T2 and pull-down TFT Tpd, using different clocks.

In addition, it is possible to control a forward scan direction and a backward scan direction through phase reversion of the n−1-th clock CLK(n−1) and n+1-th clock CLK(n+1) to respectively control the first and second TFTs T1 and T2 and, as such, a separate direction control signal or a separate direction control TFT to control scan directions can be eliminated.

As a result, each stage may be configured to achieve bi-scan, using a simple circuit configuration including a maximum of 6 TFTs T1, T2, Tpu, Tpd, Td and Tab and one capacitor CQ, and, as such, it may be possible to remarkably reduce a circuit area through the simple circuit configuration.

For example, in a shift register according to the related art, a single scan stage thereof is configured, using TFTs and two capacitors, and, as such, there is a limitation in reducing a bezel width to 0.6 mm or less. In the case of a bi-scan stage, TFTs to control scan directions must be additionally used and, as such, there is a problem of a further increase in bezel width. In the shift register according to one or more embodiments of the present invention, however, the bi-scan stage thereof has a simple configuration including 6 TFTs and one capacitor and, as such, it is possible to remarkably reduce the bezel width to 0.25 mm.

Figure 5:
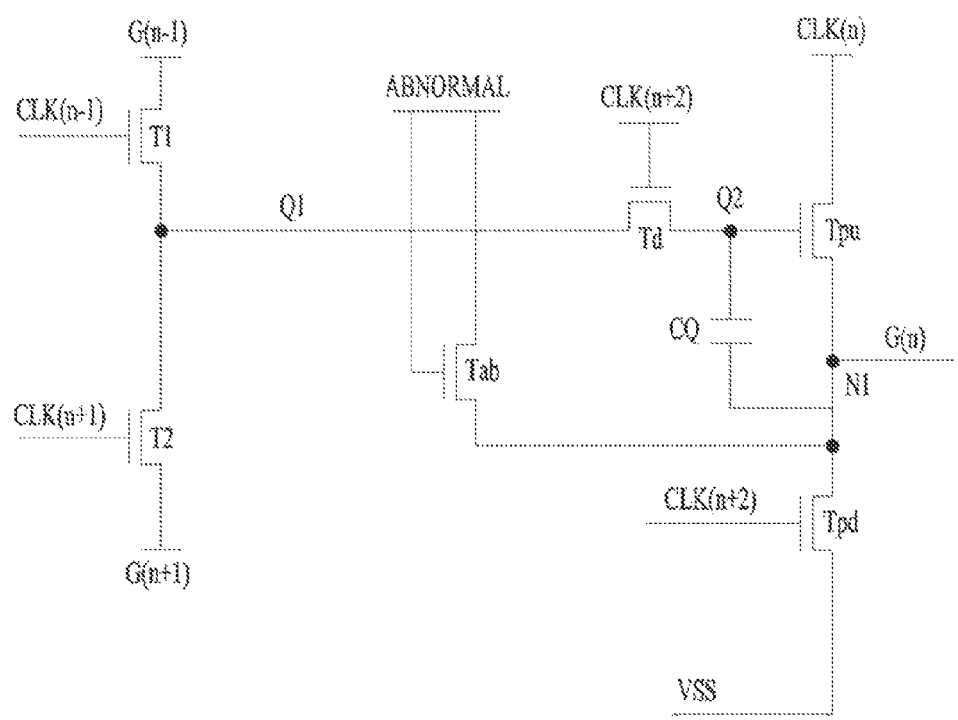
FIG. 5 is a circuit diagram illustrating one stage in a bi-scan shift register according to a second embodiment of the present invention.
Figure 6:
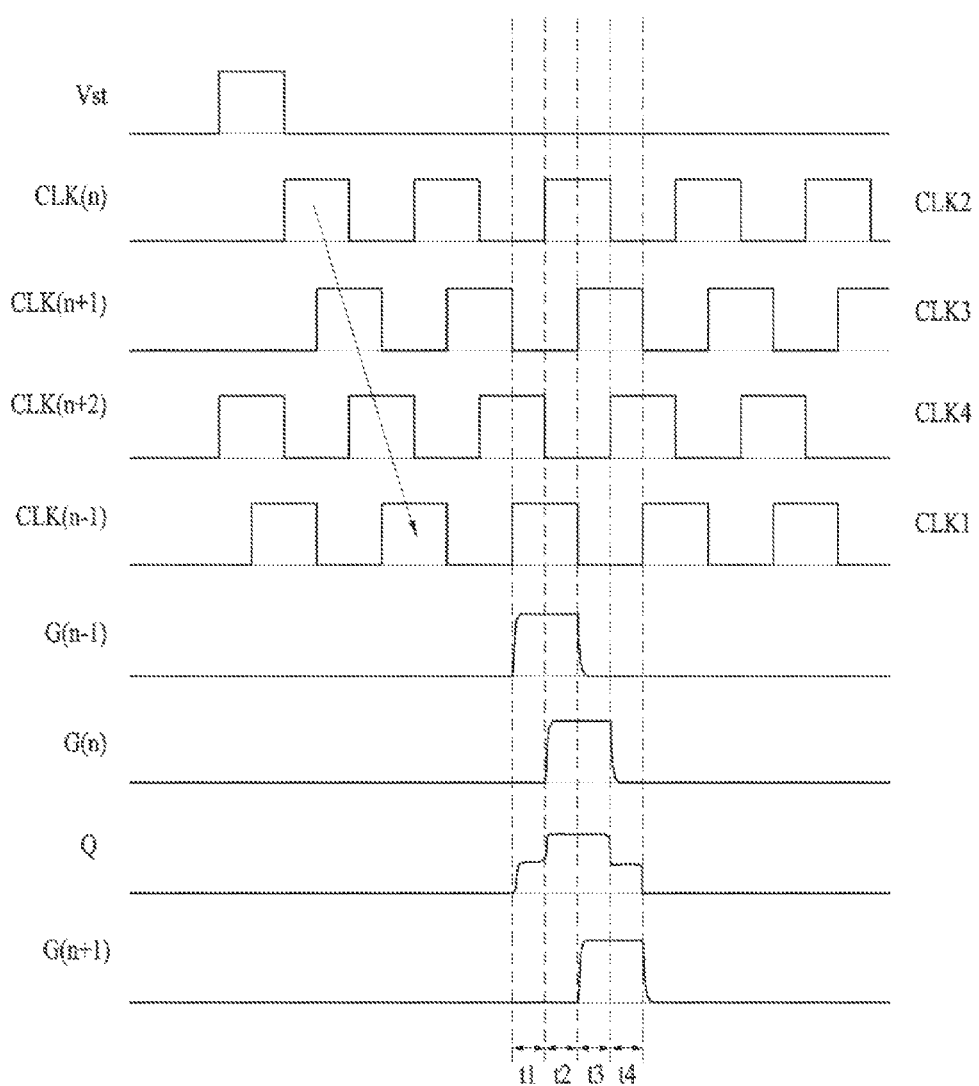
FIG. 6 is a waveform diagram of driving signals for a forward scan of the stage illustrated in FIG. 5.
Figure 7:
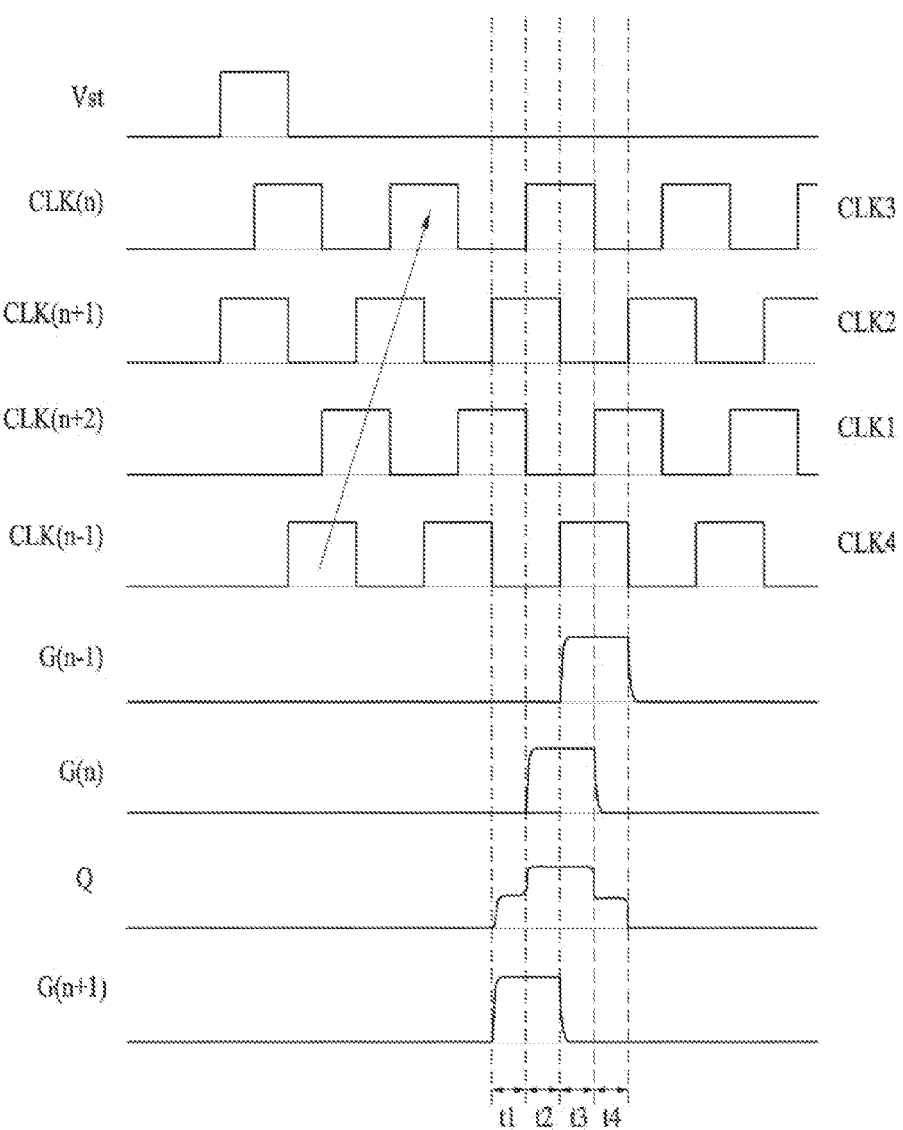
FIG. 7 is a waveform diagram of driving signals for a backward scan of the stage illustrated in FIG. 5.

FIG. 5 is a circuit diagram illustrating one stage in a bi-scan shift register according to a second embodiment of the present invention. FIGS. 6 and 7 are waveform diagrams of driving signals for forward scan and backward scan of the stage illustrated in FIG. 5.

In the following description, configurations overlapping those of the first embodiment will not be described or will be described in brief. Accordingly, the following description will be given mainly in conjunction with configurations different from those of the first embodiment.

The second embodiment of FIG. 5 differs from the first embodiment of FIG. 2 in that the n+2-th clock CLK(n+2) is supplied as a control signal to control the resistive TFT Td, in place of the gate-high voltage VGH in the first embodiment. As the resistive TFT Td is controlled in accordance with the n+2-th clock CLK(n+2), it is possible to prevent the potential of the Q2-node to fall due to turning-off of one of the first and second TFTs T1 and T2 in the period t3 in which the pull-up TFT Tpu outputs a high-level voltage of the n-th clock CLK(n).

In detail, referring to FIGS. 3 and 4, in the period t3 in which the pull-up TFT Tpu outputs a high-level voltage of the n-th clock CLK(n), one of the first and second TFTs T1 and T2 turns off, and the other of the first and second TFTs T1 and T2 turns on in accordance with the n−1-th clock CLK(n−1) and n+1-th clock CLK(n+1) having reverse phases. In this case, the potentials of the Q1-node and Q2-node may be more or less reduced due to leakage current of the turned-off TFT. As a result, an output of the scan signal G(n) through the pull-up TFT Tpu can be reduced due to the potential reduction of the Q2-node in the period t3.

In order to prevent such a phenomenon, in the second embodiment of FIG. 5, the resistive TFT Td turns off under control of the n+2-th clock CLK(n+2) in the period t2-t3 in which the pull-up TFT Tpu outputs a high-level voltage of the n-th clock CLK(n) and, as such, the Q2-node is separated from the Q1-node. Accordingly, the Q2-node is prevented from being influenced by the first and second TFTs T1 and T2.

In detail, referring to FIGS. 6 and 7, in the period t1, the resistive TFT Td turns on under control of the n+2-th clock CLK(n+2), to connect the Q1-node and Q2-node. Accordingly, the Q1-node and Q2-node are set to a high-level state under control of one of the first and second TFTs T1 and T2.

Thereafter, in the period t2-t3, the resistive TFT Td turns off under control of the n+2-th clock CLK(n+2), to separate the Q1-node and Q2-node from each other. Accordingly, the Q2-node is maintained in a stable high-level state in accordance with bootstrapping thereof along a high-level voltage of the n-th clock CLK(n). As result, the n-th clock CLK(n) is stably output through the pull-up TFT Tpu, as the scan signal G(n).

Subsequently, in the period t4, the resistive TFT Td turns on under control of the n+2-th clock CLK(n+2), to connect the Q1-node and Q2-node. Accordingly, the Q1-node and Q2-node are set to a low-level state under control of one of the first and second TFTs T1 and T2.

Figure 8:
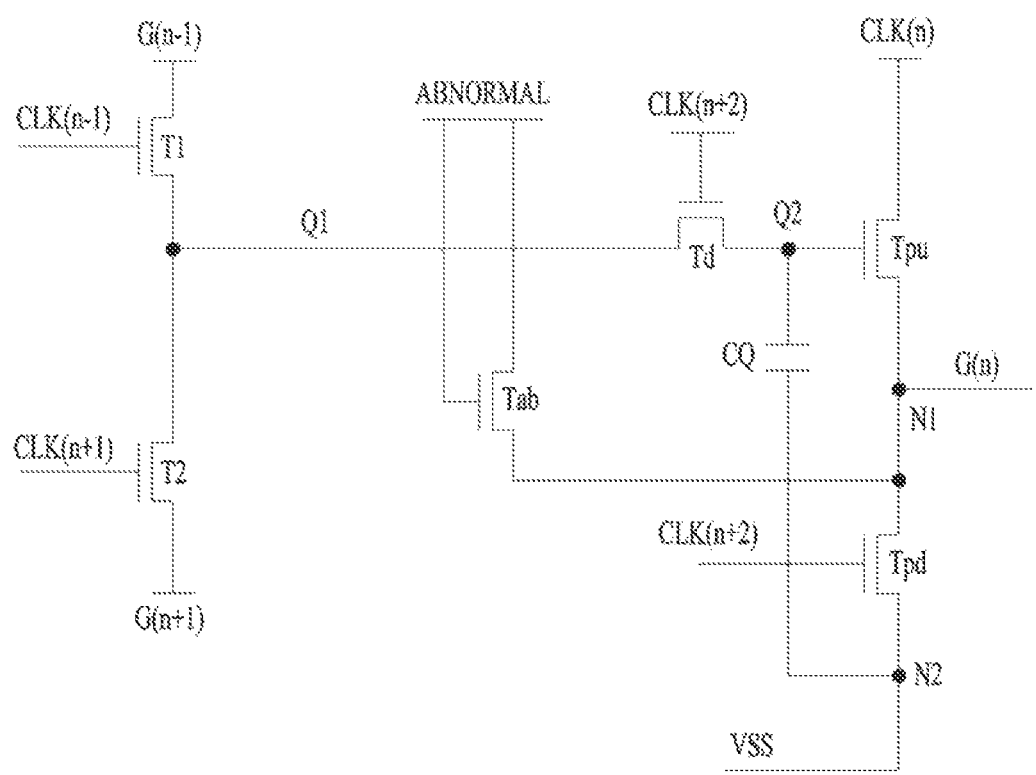
FIG. 8 is a circuit diagram illustrating one stage in a bi-scan shift register according to a third embodiment of the present invention.

FIG. 8 is a circuit diagram illustrating one stage in a bi-scan shift register according to a third embodiment of the present invention.

The third embodiment of FIG. 8 mainly differs from the second embodiment of FIG. 5 in that the capacitor CQ is connected to a node N2 between the pull-down TFT Tpd and a supply line for the low-level voltage VSS, in place of the output node N1.

In the second embodiment of FIG. 5, the capacitor CQ connected between the Q2-node and the output node N1 sensitively responds to variation in the threshold voltage Vth of the pull-up TFT Tpu. For this reason, when the threshold voltage Vth of the pull-up TFT Tpu shifts from a positive value to a negative value, the potential of the Q2-node is sensitively varied and, as such, an output of the scan signal G(n) may be unstable.

On the other hand, in the third embodiment of FIG. 8, the capacitor CQ is connected, at the other end thereof, to the source node N2 of the pull-down TFT Tpd connected to the supply line for the low-level voltage VSS. In this case, accordingly, the capacitor CQ is insensitive to variation in the threshold voltage Vth of the pull-up TFT Tpu. As a result, even when the threshold voltage Vth of the pull-up TFT Tpu shifts from a positive value to a negative value, potential variation of the Q2-node is minimized and, as such, an output of the scan signal G(n) may be stable.

Figure 9:
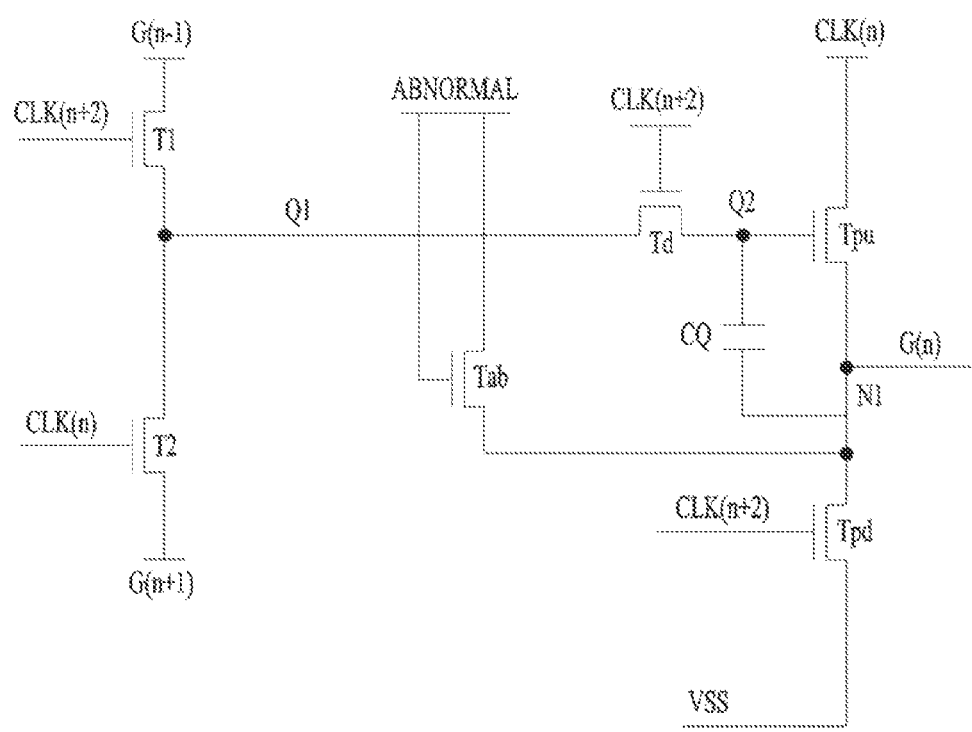
FIG. 9 is a circuit diagram illustrating one stage in a bi-scan shift register according to a fourth embodiment of the present invention.
Figure 10:
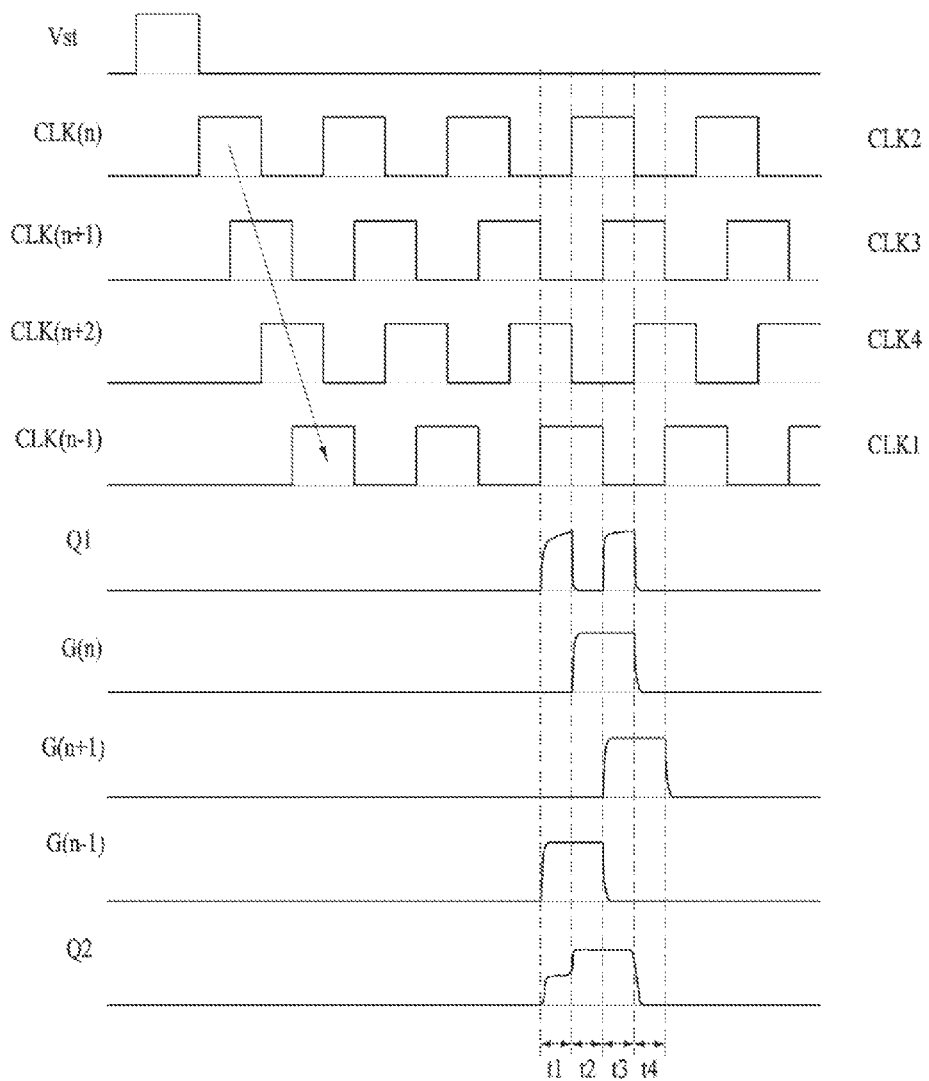
FIG. 10 is a waveform diagram of driving signals used in the stage illustrated in FIG. 9.

FIG. 9 is a circuit diagram illustrating one stage in a bi-scan shift register according to a fourth embodiment of the present invention. FIG. 10 is a waveform diagram of driving signals used in the stage illustrated in FIG. 9.

The fourth embodiment of FIG. 9 mainly differs from the second embodiment of FIG. 5 in that the first TFT T1 is controlled by the n+2-th clock CLK(n+2), in place of the n−1-th clock CLK(n−1), and the second TFT T2 is controlled by the n-th clock CLK(n), in place of the n+1-th clock CLK(n+1). Due to this difference, the fourth embodiment of FIG. 9 only enables single-scan in a forward direction, as illustrated in FIG. 10.

Of course, in the embodiment of FIG. 9, the capacitor CQ may be connected, at the other end thereof, to the source node N2 of the pull-down TFT Tpd connected to the supply line for the low-level voltage VSS, in place of the source node of the pull-up TFT Tpu, as in the embodiment of FIG. 8.

To one stage, 2-phase clocks CLK(n) and CLK(n+2) having reverse phases selected from among 4-phase clocks CLK(n), CLK(n+1), CLK(N+2) and CLK(n−1) illustrated in FIG. 10 are supplied. The remaining 2-phase clocks CLK(n+1) and CLK(n−1) are supplied to a previous or next stage adjacent to the current stage.

Referring to FIGS. 9 and 10, in the period t1, the first TFT T1, resistive TFT Td, and pull-down TFT Tpd turn on under control of the n+2-th clock CLK(n+2). The Q1-node and Q2-node are set to a high-level state by a gate-on voltage of the n−1-th scan signal G(n−1).

In the period t2, the first TFT T1, resistive TFT Td, and pull-down TFT Tpd turn off under control of the n+2-th clock CLK(n+2). On the other hand, the second TFT T2 turns on under control of the n-th clock CLK(n), and the pull-up TFT Tpu outputs the n-th clock CLK(n). In this case, the Q1-node is reset to a low-level state by a gate-off voltage of the n+1-th scan signal G(n+1) supplied through the second TFT T2, whereas the Q2-node separated from the Q1-node rises in potential along the n-th clock CLK(n) supplied to the pull-up TFT Tpu and, as such, stably outputs the n-th clock CLK(n).

In the period t3, the Q2-node separated from the Q1-node is maintained in a high-level state, as in the period t2, and, as such, stably outputs the n-th clock CLK(n) supplied to the pull-up TFT Tpu. In this case, a gate-on voltage of the n+1-th scan signal G(n+1) is supplied to the Q1-node through the second TFT T2 turned on under control of the n-th clock CLK(n) and, as such, the Q1-node has a high-level state.

In the period t4, the first TFT T1, resistive TFT Td, and pull-down TFT Tpd turn on under control of the n+2-th clock CLK(n+2). The Q1-node and Q2-node connected via the resistive TFT Td are reset by a gate-on voltage of the n−1-th scan signal G(n−1) supplied through the first TFT T1.

The low-level voltage VSS supplied through the pull-down TFT Tpd is output through the output node N1, as a gate-off voltage.

In the remaining periods, the first and second TFTs T1 and T2 alternately supply the n−1-th scan signal G(n−1) and n+1-th scan signal G(n+1), to maintain the Q1-node and Q2-node in the reset state.

Thus, each stage may be configured to achieve single-scan in a forward direction, using a circuit configuration including a maximum of 6 TFTs T1, T2, Tpu, Tpd, Td and Tab and one capacitor CQ, and, as such, it may be possible to remarkably reduce a circuit area because the circuit configuration is simple, as compared to conventional cases.

Figure 11:
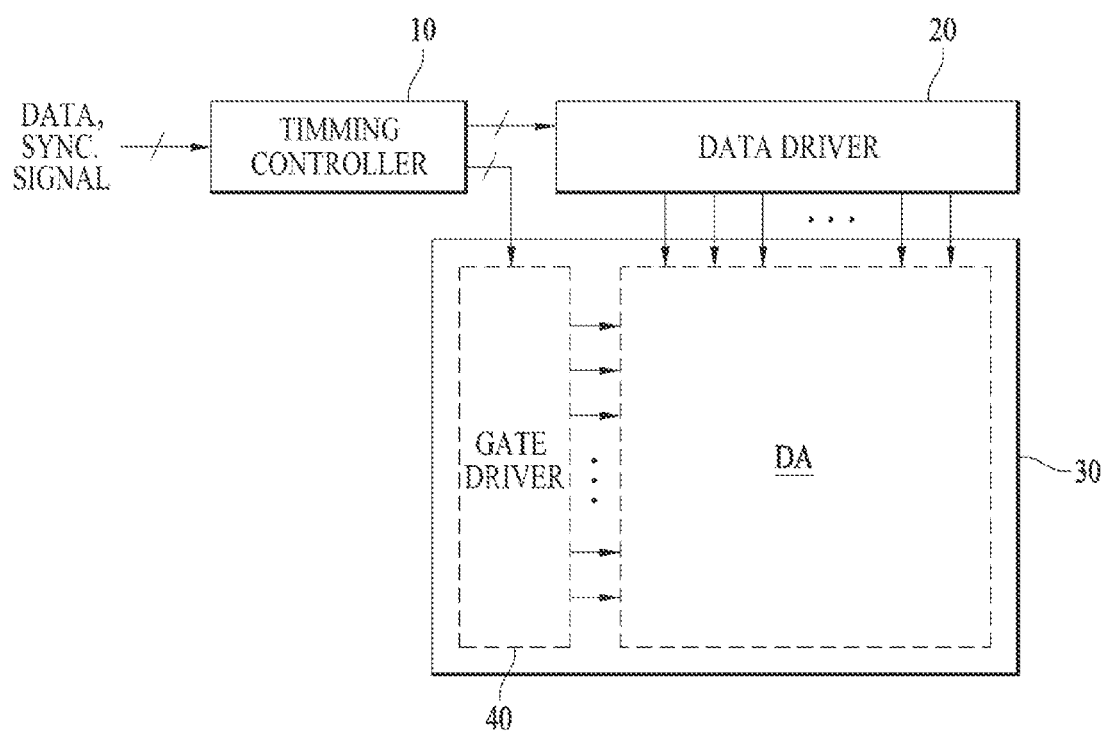
FIG. 11 is a block diagram illustrating a display device according to an embodiment of the present invention.

FIG. 11 is a block diagram illustrating a display device according to an embodiment of the present invention.

The display device illustrated in FIG. 11 includes a display panel 30 including a display area DA and a gate driver 40, a data driver 20, and a timing controller 10. All the components of the display device in this and other embodiments are operatively coupled and configured.

The display panel 30 displays an image through a pixel matrix formed in the display area DA. Each pixel of the pixel matrix typically renders desired color through a combination of red (R), green (G) and blue (B) sub-pixels. Each pixel may further include a white (W) sub-pixel for enhanced luminance. Each sub-pixel is independently driven by at least one TFT. As the display panel 30, a liquid crystal panel, an organic light emitting diode (OLED) panel, or the like may be used.

For example, each sub-pixel of the liquid crystal panel includes a liquid crystal cell, which varies an orientation direction of liquid crystals in accordance with a data voltage supplied from a data line in response to a scan pulse from a gate line, to adjust light transmittance therethrough. Each sub-pixel of the OLED panel includes a light emitting cell, which emits light in proportion to an amount of current according to a data voltage supplied from a data line in response to a scan pulse from a gate line.

The gate driver 40 is of a GIP type in which the gate driver 40 is built in a non-display area of the display panel 30. The gate driver 40 can include a plurality of TFTs formed on a substrate, together with a TFT array of the display area DA. The TFTs included in both the display area DA and the gate driver 40 may be implemented, using low-temperature poly-crystalline silicon (LTPS) TFTs. Of course, embodiments of the present invention are not limited to such TFTs. Amorphous silicon TFTs, oxide TFTs, or the like may be used.

The gate driver 40 includes one of the shift registers according to all of the embodiments (including the first to fourth embodiments) described with reference to FIGS. 1 to 10, and drives gate lines of the pixel matrix in response to gate control signals from the timing controller 10. The gate driver 40 supplies a scan pulse having a gate-on voltage in a scan period of each gate line, to turn on TFTs connected to the gate line. In the remaining periods of the gate line, the gate driver 40 supplies a gate-off voltage, to turn off the TFTs connected to the gate line.

The gate driver 40 may be formed at one side of the display area DA, to supply a scan signal through one end of each gate line. Alternatively, the gate driver 40 may be formed at opposite sides of the display area DA, to supply a scan signal through opposite ends of each gate line. The gate driver 40 may drive a plurality of gate lines through forward scan. Alternatively, the gate driver 40 may drive the gate lines, selectively using forward scan and backward scan.

A level shifter (not shown) may be additionally provided between the timing controller 10 and the gate driver 40. The level shifter level-shifts gate control signals from the timing controller 10, namely, transistor-transistor logics (TTLs) of a start pulse and a plurality of clocks, to a gate-high voltage VGH and a gate-low voltage VGL (VGL=VSS) for driving of TFTs, and supplies the gate-high voltage VGH and gate-low voltage VGL to the gate driver 40, namely, the shift register.

The data driver 20 supplies image data from the timing controller 10 to a plurality of data lines DL in response to data control signals from the timing controller 10. The data driver 20 converts data supplied from the timing controller 10 into an analog data signal, using a gamma voltage supplied from a gamma voltage generator (not shown), and supplies the data signal to the data lines DL whenever each gate line is driven. The data driver 20 may be constituted by at least one data integrated circuit (IC). In this case, the data driver 20 may be mounted on a circuit film such as a tape carrier package (TCP), a chip on film (COF), or a flexible printed circuit (FPC). The resultant structure may be attached to the display panel 30, using tape automatic bonding (TAB). Alternatively, the structure may be mounted on a non-display area of the display panel 30 in a chip on glass manner.

The timing controller 10 inputs a plurality of synchronization signals, together with image data supplied from the outside. The synchronization signals may include a dot clock and a data enable signal, or may further include a horizontal synchronization signal and a vertical synchronization signal. The timing controller 10 corrects the input data, using various data processing methods for improved picture quality or reduced power consumption, and outputs the corrected data to the data driver 20. The timing controller 10 generates data control signals to control driving timing of the data driver 20 and gate control signals to control driving timing of the gate driver 40.

As apparent from the above description, the display device according to the embodiments of the present invention uses a shift register having a simple circuit configuration, as a gate driver, and, as such, it is possible to reduce the width of the bezel, at which the gate driver is formed. Thus, a narrow bezel can be realized.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising:
a plurality of stages each selectively executing a forward scan and a backward scan, wherein:
each of the stages uses first to fourth clocks; and
each of the stages comprises:
a pull-up transistor for generating the first clock under control of a control node, as an output thereof,
a pull-down transistor for generating a gate-off voltage under control of the third clock, as an output thereof,
a first transistor for setting and resetting the control node during the forward scan while resetting the control node during the backward scan, under control of the fourth clock, using output signals from a previous one of the stages, and
a second transistor for setting and resetting the control node during the backward scan while resetting the control node during the forward scan, under control of the second clock, using output signals from a next one of the stages, and wherein:
the control node comprises a first control node connected to the first and second transistors, and a second control node connected to the pull-up transistor, and
each of the stages further comprises a resistive transistor for connecting the first and second control nodes under control of one of a gate-on voltage and the third clock.

2. The shift register according to claim 1, wherein:
each of the stages further comprises:
a bias transistor for driving a corresponding one of gate lines through an output terminal of the stage in accordance with an abnormal power-off detect signal, and
a capacitor connected, at one end thereof, to one of a first node between the pull-up transistor and the pull-down transistor and a second node between a supply line for the gate-off voltage and the pull-down transistor while being connected, at the other end thereof, to the second control node.

3. The shift register according to claim 1, wherein:
each of the first to fourth clocks has a pulse width corresponding to a period of 2H, a cycle corresponding to a period of 4H, and an overlap period of 1H overlapping another one of the first to fourth clocks, which is adjacent to the clock;
during the forward scan, the first to fourth clocks circulate in an order of the first clock, the second clock, the third clock and the fourth clock while phase-shifting; and
during the backward scan, the first to fourth clocks circulate in an order of the fourth clock, the third clock, the second clock and the first clock while phase-shifting.

4. The shift register according to claim 3, wherein:
during the forward scan, the first transistor sets the control node under control of the fourth clock, using one output signal from the previous stage, before the pull-up transistor outputs the first clock;
during the forward scan, the first transistor resets the control node under control of the fourth clock, using the output signal from the previous stage, after the pull-up transistor outputs the first clock; and
during the forward scan, the second transistor resets the control node under control of the second clock, using one output signal from the next stage, while alternating with the first transistor.

5. The shift register according to claim 3, wherein:
during the backward scan, the second transistor sets the control node under control of the second clock, using one output signal from the next stage, before the pull-up transistor outputs the first clock;
during the backward scan, the second transistor resets the control node under control of the second clock, using the output signal from the next stage, after the pull-up transistor outputs the first clock; and
during the backward scan, the first transistor resets the control node under control of the fourth clock, using one output signal from the previous stage, while alternating with the second transistor.

6. A shift register comprising:
a plurality of stages, wherein each of the stages comprises:
a pull-up transistor for generating a first one of a plurality of clocks under control of a control node, as an output thereof;
a pull-down transistor for generating a gate-off voltage under control of a second one of the clocks, as an output thereof, the second clock having a reverse phase to the first clock;
a first transistor for setting and resetting the control node under control of the second clock, using output signals from a previous one of the stages; and
a second transistor for resetting the control node under control of the first clock, using an output signal from a next one of the stages, while alternating with the first transistor,
wherein:
the control node comprises a first control node connected to the first and second transistors, and a second control node connected to the pull-up transistor, and
each of the stages further comprises a resistive transistor for connecting the first and second control nodes under control of one of a gate-on voltage and the third clock.

7. The shift register according to claim 6, wherein:
each of the stages further comprises:
a bias transistor for driving a corresponding one of gate lines through an output terminal of the stage in accordance with an abnormal power-off detect signal, and
a capacitor connected, at one end thereof, to one of a first node between the pull-up transistor and the pull-down transistor and a second node between a supply line for the gate-off voltage and the pull-down transistor while being connected, at the other end thereof, to the second control node.

8. A display device comprising:
a display panel; and
a shift register comprising a plurality of stages each selectively executing a forward scan and a backward scan to drive gate lines of the display panel, wherein:
each of the stages uses first to fourth clocks; and
each of the stages comprises:
a pull-up transistor for generating the first clock under control of a control node, as an output thereof,
a pull-down transistor for generating a gate-off voltage under control of the third clock, as an output thereof,
a first transistor for setting and resetting the control node during the forward scan while resetting the control node during the backward scan, under control of the fourth clock, using output signals from a previous one of the stages, and
a second transistor for setting and resetting the control node during the backward scan while resetting the control node during the forward scan, under control of the second clock, using output signals from a next one of the stages, and
wherein:
the control node comprises a first control node connected to the first and second transistors, and a second control node connected to the pull-up transistor, and
each of the stages further comprises a, resistive transistor for connecting the first and second control nodes under control of one of a gate-on voltage and the third clock.

9. The display device according to claim 8, wherein:
each of the stages further comprises:
a bias transistor for driving a corresponding one of gate lines through an output terminal of the stage in accordance with an abnormal power-off detect signal, and
a capacitor connected, at one end thereof, to one of a first node between the pull-up transistor and the pull-down transistor and a second node between a supply line for the gate-off voltage and the pull-down transistor while being connected, at the other end thereof, to the second control node.

10. The display device according to claim 8, wherein:
each of the first to fourth clocks has a pulse width corresponding to a period of 2H, a cycle corresponding to a period of 4H, and an overlap period of 1H overlapping another one of the first to fourth clocks, which is adjacent to the clock;
during the forward scan, the first to fourth clocks circulate in an order of the first clock, the second clock, the third clock and the fourth clock while phase-shifting; and
during the backward scan, the first to fourth clocks circulate in an order of the fourth clock, the third clock, the second clock and the first clock while phase-shifting.

11. The display device according to claim 10, wherein:
during the forward scan, the first transistor sets the control node under control of the fourth clock, using one output signal from the previous stage, before the pull-up transistor outputs the first clock;
during the forward scan, the first transistor resets the control node under control of the fourth clock, using the output signal from the previous stage, after the pull-up transistor outputs the first clock; and
during the forward scan, the second transistor resets the control node under control of the second clock, using one output signal from the next stage, while alternating with the first transistor.

12. The display device according to claim 10, wherein:
during the backward scan, the second transistor sets the control node under control of the second clock, using one output signal from the next stage, before the pull-up transistor outputs the first clock;
during the backward scan, the second transistor resets the control node under control of the second clock, using the output signal from the next stage, after the pull-up transistor outputs the first clock; and
during the backward scan, the first transistor resets the control node under control of the fourth clock, using one output signal from the previous stage, while alternating with the second transistor.

13. A display device comprising:
a display panel; and
a shift register comprising a plurality of stages to drive gate lines of the display panel,
wherein each of the stages comprises:
a pull-up transistor for generating a first one of a plurality of clocks under control of a control node, as an output thereof;
a pull-down transistor for generating a gate-off voltage under control of a second one of the clocks, as an output thereof, the second clock having a reverse phase to the first clock;
a first transistor for setting and resetting the control node under control of the second clock, using output signals from a previous one of the stages; and a second transistor for resetting the control node under control of the first clock, using an output signal from a next one of the stages, while alternating with the first transistor, and wherein:

the control node comprises a first control node connected to the first and second transistors, and a second control node connected to the pull-up transistor, and each of the stages further comprises a resistive transistor for connecting the first and second control nodes under control of one of a gate-on voltage and the third clock.

14. The display device according to claim 13, wherein:

each of the stages further comprises:

a bias transistor for driving a corresponding one of gate lines through an output terminal of the stage in accordance with an abnormal power-off detect signal, and a capacitor connected, at one end thereof, to one of a first node between the pull-up transistor and the pull-down transistor and a second node between a supply line for the gate-off voltage and the pull-down transistor while being connected, at the other end thereof, to the second control node.

* * * * *